United States Patent [19]

Komatsuda et al.

[11] Patent Number: 5,594,587
[45] Date of Patent: Jan. 14, 1997

[54] ILLUMINATION DEVICE WITH ALLOWABLE ERROR AMOUNT OF TELECENTRICITY ON THE SURFACE OF THE OBJECT TO BE ILLUMINATED AND EXPOSURE APPARATUS USING THE SAME

[75] Inventors: Hideki Komatsuda, Kawasaki; Hideo Hirose, Saitama-ken; Tetsuo Kikuchi, Tokyo, all of Japan

[73] Assignee: Nikon Corporation, Japan

[21] Appl. No.: 402,250

[22] Filed: Mar. 10, 1995

[30] Foreign Application Priority Data

Mar. 11, 1994 [JP] Japan ................... 6-040771

[51] Int. Cl.⁶ .................... G03B 27/10; G03B 27/54; G03B 27/72
[52] U.S. Cl. .................. 359/619; 355/67; 355/71
[58] Field of Search .................... 359/618, 619; 355/67, 71; 362/268

[56] References Cited

U.S. PATENT DOCUMENTS

| | | | |
|---|---|---|---|
| 4,497,015 | 1/1985 | Konno et al. | 362/268 |
| 4,619,508 | 10/1986 | Shibuya | 353/122 |
| 4,939,630 | 7/1990 | Kikuchi et al. | 362/268 |
| 5,237,367 | 8/1993 | Kudo | 355/67 |
| 5,245,384 | 9/1993 | Mori | 355/67 |
| 5,287,142 | 2/1994 | Kamon | 355/53 |
| 5,296,892 | 3/1994 | Mori | 355/67 |
| 5,335,044 | 8/1994 | Shiraishi | 355/53 |
| 5,357,312 | 10/1994 | Tounai | 355/67 |
| 5,379,090 | 1/1995 | Shiraishi | 355/67 |
| 5,392,094 | 2/1995 | Kudo | 355/67 |
| 5,420,417 | 5/1995 | Shiraishi | 250/205 |
| 5,436,692 | 7/1995 | Noguchi | 355/53 |

FOREIGN PATENT DOCUMENTS

| | | |
|---|---|---|
| 0496891A1 | 8/1992 | European Pat. Off. . |
| 57-62052 | 4/1982 | Japan . |

*Primary Examiner*—Georgia Y. Epps
*Assistant Examiner*—Ricky Mack
*Attorney, Agent, or Firm*—Pennie & Edmonds

[57] ABSTRACT

The illumination device of the present invention is directed to an illumination device comprising a light source system for generating illumination light, a collimate optical system for collimating the illumination light from the light source system into a substantially collimated light beam, an optical integrator for forming a plurality of light source images on the basis of the light beam from the collimate optical system, a variable aperture stop arranged at an exit surface of the optical integrator, and a condenser lens system for guiding the light beam from the optical integrator to a surface of an object to be illuminated, and making an incident surface of the optical integrator conjugate with the surface of the object to be illuminated.

16 Claims, 6 Drawing Sheets

ILLUMINANCE

ILLUMINANCE

ILLUMINATION DEVICE WITH ALLOWABLE ERROR AMOUNT OF TELECENTRICITY ON THE SURFACE OF THE OBJECT TO BE ILLUMINATED AND EXPOSURE APPARATUS USING THE SAME

BACKGROUND OF THE INVENTION

1. Field of the Invention

The present invention relates to an illumination device for illuminating an object to be illuminated and an exposure apparatus using the illumination device and, more particularly, to an illumination device for illuminating a reticle, on which a pattern to be transferred is formed, in an exposure apparatus for manufacturing, e.g., a semiconductor element, a liquid crystal display element, or the like, and a projection exposure apparatus using the illumination device.

2. Related Background Art

For example, in the manufacture of a semiconductor element, a liquid crystal display element, or the like in a photolithography process, a projection exposure apparatus for transferring a pattern formed on a photomask or a reticle (a "reticle" will be used as an example hereinafter) onto a wafer (or a glass plate, or the like) via a projection optical system under predetermined illumination light, a proximity type exposure apparatus for directly transferring a pattern on a reticle onto a wafer arranged in the vicinity of the reticle, or the like is used. Such an exposure apparatus (to be referred to as a "semiconductor exposure apparatus" hereinafter) uses an illumination device for illuminating a predetermined region on a reticle at an illuminance as uniformly as possible using an optical integrator to reduce any nonuniformity of exposure amount on a photosensitive substrate. In this case, the numerical aperture (N.A.) of illumination light is set by the diameter of an illumination system aperture stop, which is arranged at the position of a light source image formed by the optical integrator.

As a conventional illuminance device of this type, a device which uses illumination light with a fixed numerical aperture is mainly used. In recent years, however, as a super-resolution technique such as a so-called variable-shape light source method (e.g., see Japanese Patent Laid-Open No. 4-101148), a phase shift mask method (e.g., see Japanese Patent Publication No. 62-50811), or the like has been developed, such a technique cannot be utilized while the numerical aperture is fixed. Recently, a mechanism in which an illumination system aperture stop for determining the numerical aperture has a continuously variable diameter, a mechanism in which stops with various patterns can be selectively set in a revolver method, or the like is adopted.

SUMMARY OF THE INVENTION

It is, therefore, an object of the present invention to provide an illumination device which can maintain the error amount of telecentricity on the surface of an object to be illuminated to be equal to or smaller than a desired value without using a complicated adjustment mechanism even when the shape of an aperture of an aperture stop in the illumination device is changed.

It is another object of the present invention to provide an exposure apparatus which can maintain the error amount of telecentricity on a wafer to be equal to or smaller than a desired value using the illumination device.

The illumination device of the present invention is directed to an illumination device comprising a light source system for generating illumination light, a collimate optical system for collimating the illumination light from the light source system into a substantially collimated light beam, an optical integrator for forming a plurality of light source images on the basis of the light beam from the collimate optical system, a variable aperture stop arranged at an exit surface of the optical integrator, and a condenser lens system for guiding the light beam from the optical integrator to a surface of an object to be illuminated, and making an incident surface of the optical integrator conjugate with the surface of the object to be illuminated.

According to the present invention, when the width, in a predetermined direction, of each of a plurality of lens elements constituting the optical integrator is represented by 2d, the focal length of the condenser lens system is represented by $f_{con}$, the maximum and minimum values of the effective diameter of the variable aperture stop are respectively represented by $2R_{max}$ and $2R_{min}$, the average values of illuminances on the surface of the object to be illuminated obtained when the effective diameter of the variable aperture stop assumes the maximum and minimum values are respectively represented by $E_{max}$ and $E_{min}$, and the allowable error amount of telecentricity on the surface of the object to be illuminated is represented by A, the illumination device satisfies the following condition:

$$d\{(R_{max}^2 E_{min})/(E_{max} R_{min}^2) - 1\} \leq f_{con} \cdot A \tag{1}$$

In this case, an example of the light source system has a light source for generating illumination light, and an elliptic mirror which has a first focal point at which the light source is arranged.

The exposure apparatus according to the present invention is directed to an exposure apparatus comprising a light source system for generating illumination light, a collimate optical system for collimating the illumination light from the light source system into a substantially collimated light beam, an optical integrator for forming a plurality of light source images on the basis of the light beam from the collimate optical system, a variable aperture stop arranged at an exit surface of the optical integrator, a condenser lens system for guiding the light beam from the optical integrator to a mask surface, and making an incident surface of the optical integrator conjugate with the mask surface, and a projection optical system for exposing a pattern on a mask surface onto an object to be exposed.

According to the present invention, when the width, in a predetermined direction, of each of a plurality of lens elements constituting the optical integrator is represented by 2d, the focal length of the condenser lens system is represented by $f_{con}$, the projection magnification of the projection optical system is represented by B, the maximum and minimum values of the effective diameter of the variable aperture stop are respectively represented by $2R_{max}$ and $2R_{min}$, the average values of illuminances on the surface of the object to be illuminated obtained when the effective diameter of the variable aperture stop assumes the maximum and minimum values are respectively represented by $E_{max}$ and $E_{min}$, and the allowable error amount of telecentricity on the object to be exposed is represented by a, the exposure apparatus satisfies the following condition:

$$d\{(R_{max}^2 E_{min})/(E_{max} R_{min}^2) - 1\} \leq f_{con} \cdot B \cdot a \tag{2}$$

In this case as well, an example of the light source system has a light source for generating illumination light, and an elliptic mirror which has a first focal point at which the light source is arranged.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

Figure 1A:
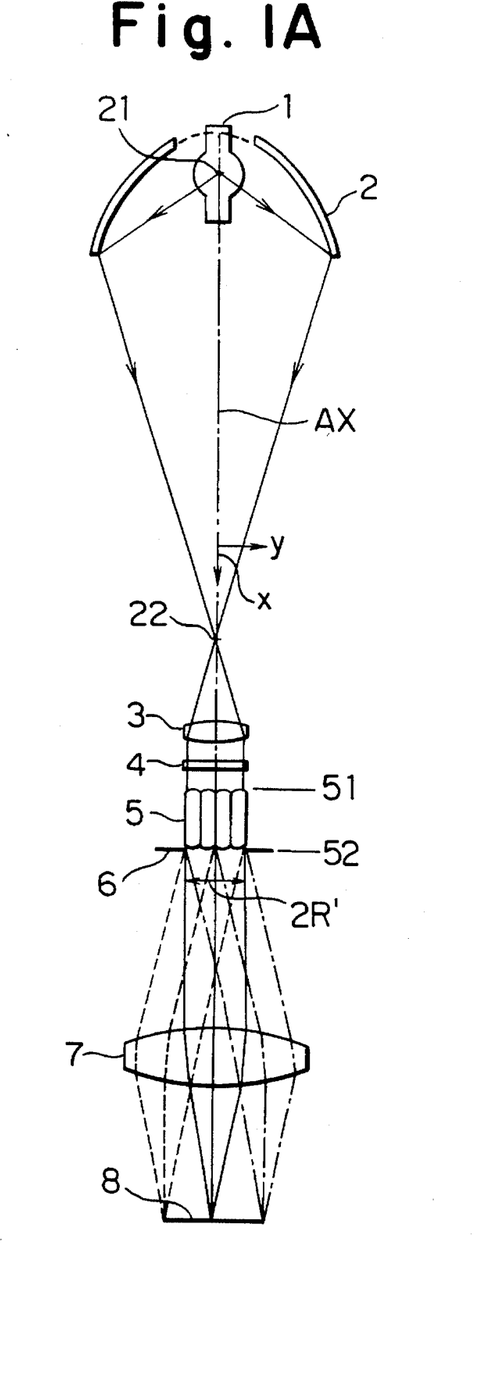
FIG. 1A is a schematic view showing the arrangement of a general illumination device.

FIG. 1A shows an illumination device used in a general semiconductor exposure apparatus. Referring to FIG. 1A, a mercury lamp 1 as a light source is arranged at a first focal point 21 of a focusing mirror 2 having a reflection surface defined by a rotary elliptic surface, and a light source image (secondary light source) is formed at a second focal point 22 of the focusing mirror 2. A light beam emanating from the secondary light source is converted into an almost collimated light beam by a collimator lens 3, and the light beam is incident on a band-pass filter 4. Illumination light having an exposure wavelength (g-line (wavelength: 436 nm), i-line (365 nm), or the like of mercury) selected by the band-pass filter 4 is incident on a fly-eye lens 5 consisting of a large number of lens elements, and a large number of light source images (tertiary light sources) are formed on an exit-side focal plane 52 of the fly-eye lens 5. Here, the fly-eye lens 5 constitutes an optical integrator.

Figure 1B:
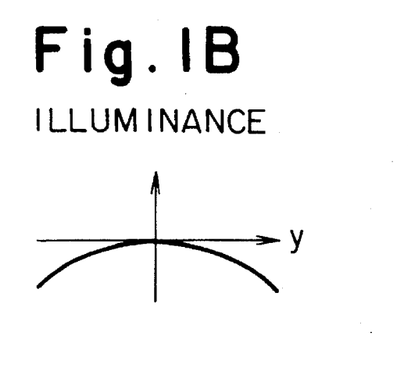
FIG. 1B is a graph showing the illuminance distribution on the incident surface of a fly-eye lens 5 shown in FIG. 1A.

In this case, the illuminance distribution of the illumination light on the incident surface of the fly-eye lens 5 is roughly expressed by a quadratic function of the distance from the optical axis, as shown in FIG. 1B. In FIG. 1A, a variable aperture stop 6 is arranged on the focal plane 52, and light beams emanating from a large number of tertiary light sources in the aperture of the variable aperture stop 6 are focused by a condenser lens 7 to illuminate an illumination region on the pattern formation surface of a reticle 8, on which an exposure pattern is formed, in an overlapping manner. An x-axis is defined in a direction parallel to the optical axis of the illumination device, a y-axis is defined in a direction perpendicular to the x-axis and parallel to the plane of the drawing of FIG. 1A, and a z-axis is defined in a direction perpendicular to the plane of the drawing of FIG. 1A.

In this case, the second focal point 22 of the focusing mirror 2 and the exit-side focal plane 52 of the fly-eye lens 5 are optically conjugate with the light source 1, as described above, and the numerical aperture of illumination light on the illumination region of the reticle 8 as a surface to be irradiated is determined by the aperture size of the variable aperture stop 6 arranged on the focal plane 52. The numerical aperture of an illumination system must be set to be an optimal value in consideration of the numerical aperture of a projection optical system, pattern size, and the like since it largely influences the resolving power, focal depth, image quality, and the like of a projected image. The pattern formation surface of the reticle 8 is conjugate with an incident-side focal plane 51 of the fly-eye lens 51, the incident surfaces of the respective lens elements constituting the fly-eye lens 5 serve as field stops, and light beams limited by these field stops overlap each other on the surface to be irradiated via the condenser lens 7.

In this case, as a means for focusing light emitted by the mercury lamp 1, the focusing mirror 2 having a rotary elliptic surface is used. The elliptic surface will be examined in depth below.

Figure 2:
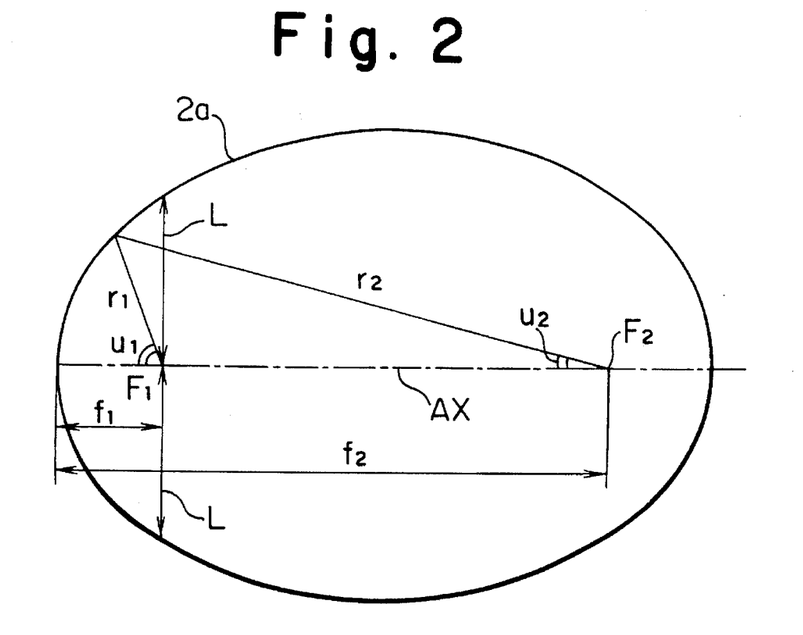
FIG. 2 is an explanatory view of the optical nature of an elliptic surface of a focusing mirror 2 shown in FIG. 1A.

FIG. 2 shows a section including the optical axis of the rotary elliptic surface as the reflection surface of the focusing mirror 2, i.e., an elliptic surface 2a. As shown in FIG. 2, the elliptic surface 2a is defined by a locus of a point where a sum $(r_1+r_2)$ of a distance $r_1$ from a first focal point $F_1$ and a distance $r_2$ from a second focal point $F_2$ becomes constant, and hence, the elliptic surface 2a has an important optical nature in that no spherical aberration is present at the two focal points $F_1$ and $F_2$.

As shown in FIG. 2, in a plane including an axis (to be referred to as an "optical axis AX" hereinafter) passing the two focal points $F_1$ and $F_2$, if an angle defined between the optical axis AX and light, which propagates from the focal point $F_1$ toward the elliptic surface 2a at an angle $u_1$ with respect to the optical axis AX, is reflected by the elliptic surface 2a, and then propagates toward the focal point $F_2$, is represented by $u_2$, and the latus rectum is represented by 2L, the elliptic surface 2a can be expressed in the form of the following polar equations using an eccentricity E (see "Mathematical Formulas", p. 58, Kyoritsu Zensho 138, Kyoritsu Shuppan, 1959):

$$r_1 = L/(1 + E \cdot \cos u_1) \qquad (3)$$

$$r_2 = L/(1 - E \cdot \cos u_2) \qquad (4)$$

If the distances from the vertex of an ellipse to the two focal points $F_1$ and $F_2$ are respectively represented by $f_1$ and $f_2$, the latus rectum 2L and the eccentricity E can be respectively expressed as follows:

$$L = 2f_1 f_2 / (f_1 + f_2) \quad (5)$$

$$E = (f_2 - f_1) / (f_1 + f_2) \quad (6)$$

Therefore, the following formula is obtained:

$$r_1 = 2f_1 f_2 / \{(f_1 + f_2) + (f_2 - f_1) \cos u_1\} \quad (7)$$

In this case, since $r_2 = f_1 + f_2 - r_1$, the distance $r_2$ is given, from formula (7), by the following formula:

$$r_2 = \{(f_1^2 + f_2^2) + (f_2^2 - f_1^2) \cos u_1\} / \{(f_1 + f_2) + (f_2 - f_1) \cos u_1\} \quad (8)$$

Since a paraxial lateral magnification $\beta$ of the elliptic surface 2a is given by $\beta = f_2/f_1$, formulas (7) and (8) are rewritten using $\beta$ as follows:

$$r_1 = 2f_2 / \{(\beta + 1) + (\beta - 1) \cos u_1\} \quad (9)$$

$$r_2 = f_1 \{(\beta^2 + 1) + (\beta^2 - 1) \cos u_1\} / \{(\beta + 1) + (\beta - 1) \cos u_1\} \quad (10)$$

The following formula is derived from formulas (4) and (10):

$$\cos u_2 = \{(\beta^2 - 1) + (\beta^2 + 1) \cos u_1\} / \{(\beta^2 + 1) + (\beta^2 - 1) \cos u_1\} \quad (11)$$

In this case, since $\sin u_2 = (1 - \cos^2 u_2)^{1/2}$, the following formula is obtained:

$$\sin u_2 = 2\beta \sin u_1 / \{(\beta^2 + 1) + (\beta^2 - 1) \cos u_1\} \quad (12)$$

From formula (12), the following sine condition dissatisfaction amount $\Delta$ of the elliptic surface 2a is obtained:

$$\Delta = \beta - (\sin u_1 / \sin u_2) \quad (13)$$
$$= \beta - \{(\beta^2 + 1) + (\beta^2 - 1) \cos u_1\} / (2\beta)$$

The sine condition dissatisfaction amount $\Delta$ of the elliptic surface 2a assumes a larger absolute value as the angle $u_1$ becomes larger. More specifically, although no spherical aberration is present between the two focal points of the elliptic surface 2a, the elliptic surface 2a does not satisfy the sine condition and is not an aplanatic conjugate point.

The collimator lens 3 normally satisfies the sine condition, and if the focal length of the collimator 3 is represented by $f_{col}$, the incident angle of illumination light onto the collimator lens 3 is represented by $u_2$, and the image height on the surface to be irradiated (in this case, the incident surface of the fly-eye lens 5) is represented by $h$, they hold the following relationship:

$$f = f_{col} \sin u_2 \quad (14)$$

Substitution of formula (12) into this formula yields:

$$h = 2f_{col} \beta \sin u_1 / \{(\beta^2 + 1) + (\beta^2 - 1) \cos u_1\} \quad (15)$$

The illuminance will be examined below. In FIG. 1A, the light-emitting unit of the mercury lamp 1 is assumed to be a point, the luminance of the light-emitting unit of the mercury lamp 1 is represented by I, and the illuminance on the incident surface of the fly-eye lens 5 is represented by e. If a minute rotational angle about the optical axis AX is represented by $d\psi$, energy (power) per unit time of illumination light irradiated from the mercury lamp 1 to a minute solid angle which has an angle of $u_1$ to $(u_1 + du_1)$ with respect to the optical axis AX and a minute rotational angle $d\psi$ about the optical axis AX is given by:

$$I \cdot du_1 \cdot d\psi \cdot \sin u_1$$

This power will be examined from the side of the light-receiving surface, i.e., on the incident surface of the fly-eye lens 5. More specifically, energy per unit time of illumination light irradiated onto a region having an image height of $h$ to $(h+dh)$ and a minute rotational angle $d\psi$ about the optical axis AX on the incident surface of the fly-eye lens 5 is given by:

$$e \cdot h \cdot dh \cdot d\psi$$

Since these energies are equal to each other, the following relationship is obtained:

$$I \cdot du_1 \cdot d\psi \cdot \sin u_1 = e \cdot h \cdot dh \cdot d\psi \quad (16)$$

When formula (15) and a differential of formula (15) are substituted in formula (16), and the obtained formula is rewritten, the following formula is obtained:

$$e = I \{(\beta^2 + 1) + (\beta^2 - 1) \cos u_1\}^3 / [4f_{col}^2 \beta^2 \{(\beta^2 - 1) + (\beta^2 + 1) \cos u_1\}] \quad (17)$$

Figure 3:
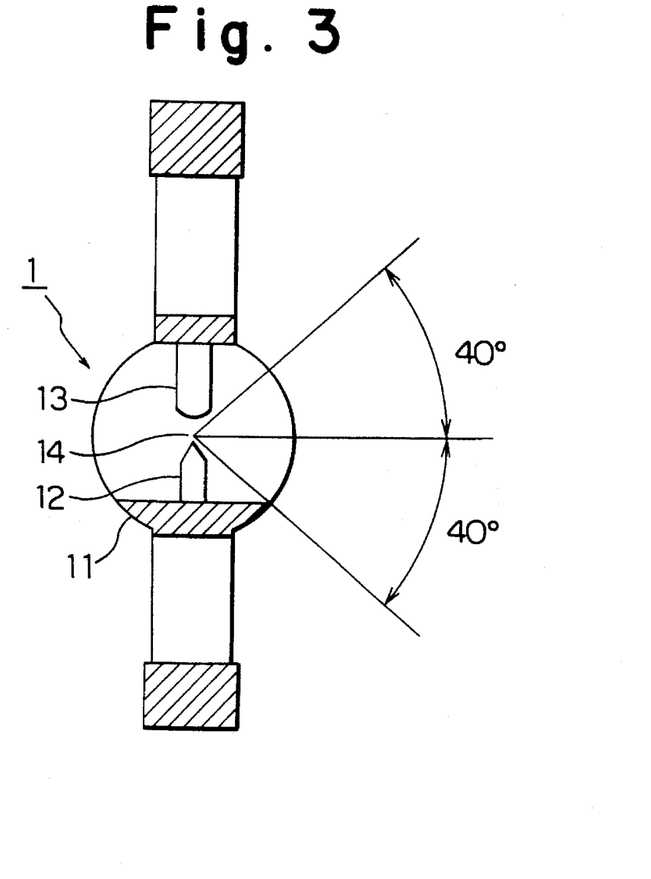
FIG. 3 is an enlarged view showing the light distribution state of a mercury lamp 1 shown in FIG. 1A.
Figure 4:
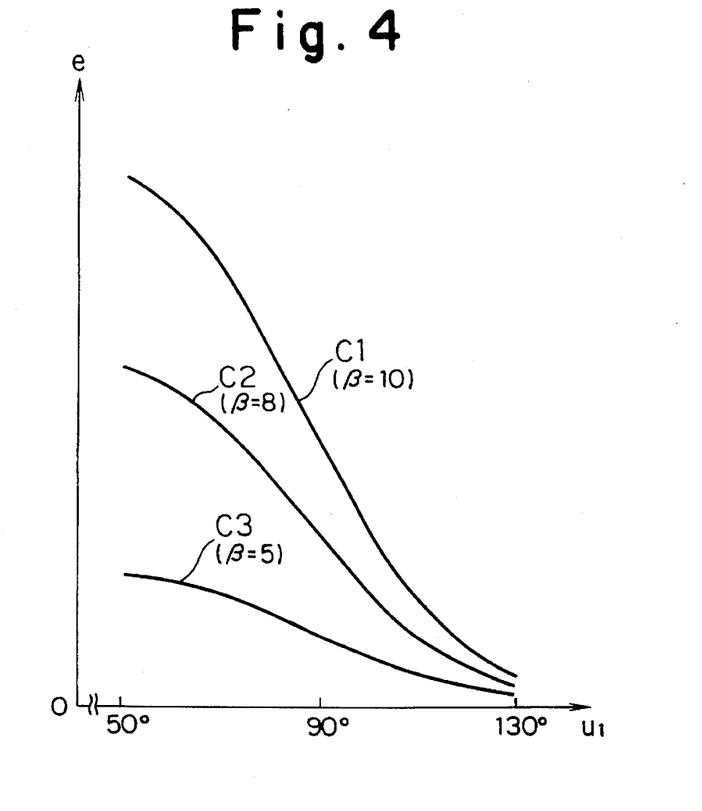
FIG. 4 is a graph showing the relationship between an angle $u_1$ and an illuminance e obtained when the paraxial lateral magnification of the elliptic surface of the focusing mirror 2 is changed.

Assume that a short-arc type mercury lamp 1 shown in FIG. 3 is used as the light source. Referring to FIG. 3, in the mercury lamp 1, mercury, a rare gas for starting, and the like are sealed in a quartz bulb 11, and a DC voltage is applied across electrodes 12 and 13 which oppose each other with a small gap therebetween, thereby performing discharge light emission. The light emitted from the mercury lamp 1 is distributed within a range of ±40° ($u_1 = 50°$ to 130°) to have the angle $u_1 = 90°$ substantially at the center. FIG. 4 shows the calculation results of the illuminance e on the incident surface of the fly-eye lens 5 for various paraxial lateral magnifications $\beta(=f_2/f_1)$ using formula (17) within the above-mentioned angle range. In FIG. 4, curves C1, C2, and C3 respectively represent the calculation results obtained when the paraxial lateral magnification $\beta = 10$, 8, and 5. The smaller the angle $u_1$ becomes, the position is closer to the central portion of the fly-eye lens 5. As the angle $u_1$ becomes smaller, the illuminance e tends to assume a larger value.

As can be seen from FIG. 4, in the illumination device utilizing the focusing mirror 2, the intensity distribution of a light beam incident on the fly-eye lens is higher toward the central portion, i.e., as an incident surface portion of the fly-eye lens 5 is closer to the optical axis AX, it is illuminated brighter.

Figure 5:
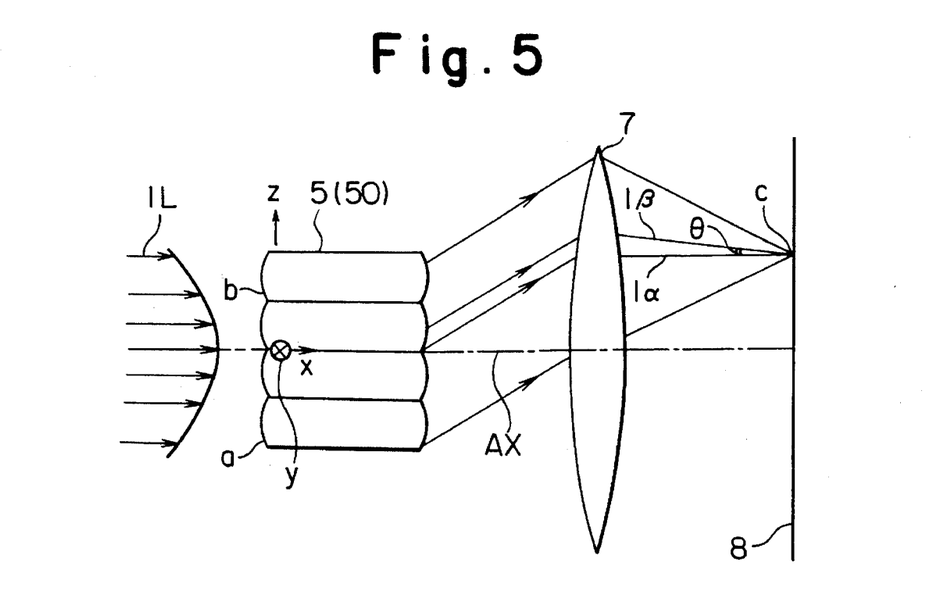
FIG. 5 is an explanatory view of a state in which telecentricity is lost in the general illumination device.

Referring back to FIG. 1A, in the illumination device to which the present invention is to be applied, the apertures of the small lenses constituting the fly-eye lens 5 on the incident surface 51 of the fly-eye lens 5 are respectively conjugate with the surface to be irradiated (the pattern formation surface of the reticle 8). As shown in FIG. 5, when a light beam IL which has a higher brightness at its central portion (near the optical axis AX) is incident on the fly-eye lens 5, points a and b on the incident surface of the fly-eye lens 5 in FIG. 5 become conjugate with a single point c on the pattern formation surface of the reticle 8 as the surface to be irradiated. In other words, although a light beam which propagates toward the point c on the surface to be irradiated is defined by rays incident on the points a, b, and the like, an effective principal ray Iβ different from a principal ray Iα of the light beam is formed due to the different intensities of the light beam IL at the points a and b, and a tilt of an angle θ is generated therebetween.

The principal ray Iα in this case is a ray which passes the optical axis AX on the exit surface of the fly-eye lens 5, and the effective principal ray Iβ is a ray which passes the barycentric position of the illuminance distribution on the exit surface of the fly-eye lens 5. The angle θ of the effective principal ray Iβ with respect to the principal ray Iα corresponds to the error of telecentricity. For this reason, conventionally, in the design of an illumination device, an offset corresponding to the angle θ is added to a relative positional relationship between the light beam IL and the fly-eye lens 5.

As described above, in general, in order to correct the error of telecentricity caused by the angle θ of the effective principal ray Iβ with respect to the principal ray Iα, a predetermined offset adjustment is performed.

Figure 6A:
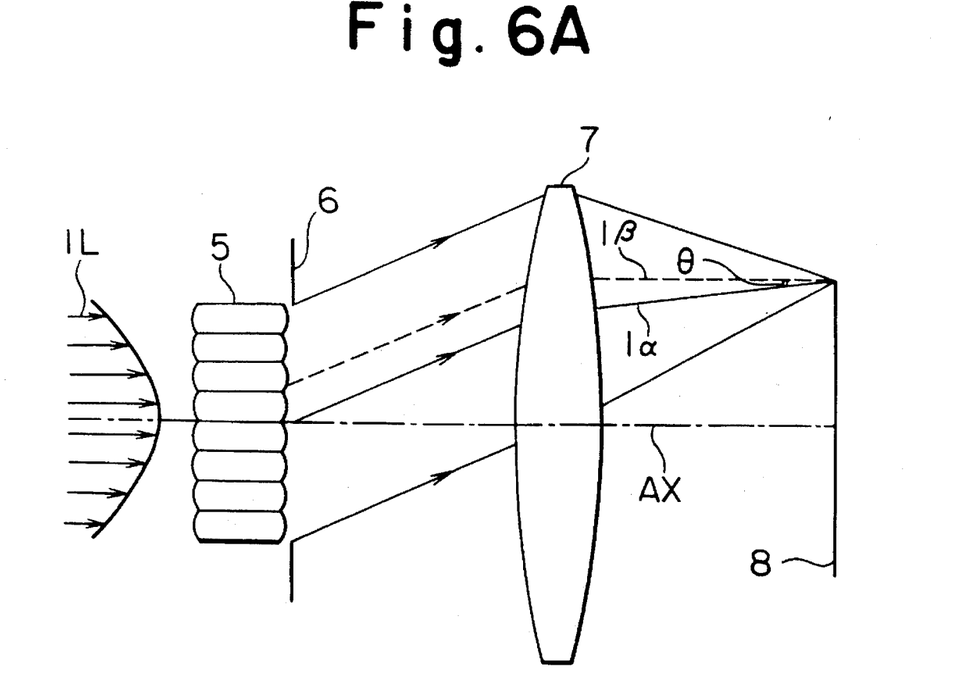
FIGS. 6A and 6B are explanatory views showing the fact that the error amount of telecentricity varies depending on the aperture size of a variable aperture stop 6 arranged at the exit surface of the fly-eye lens 5.
Figure 6B:
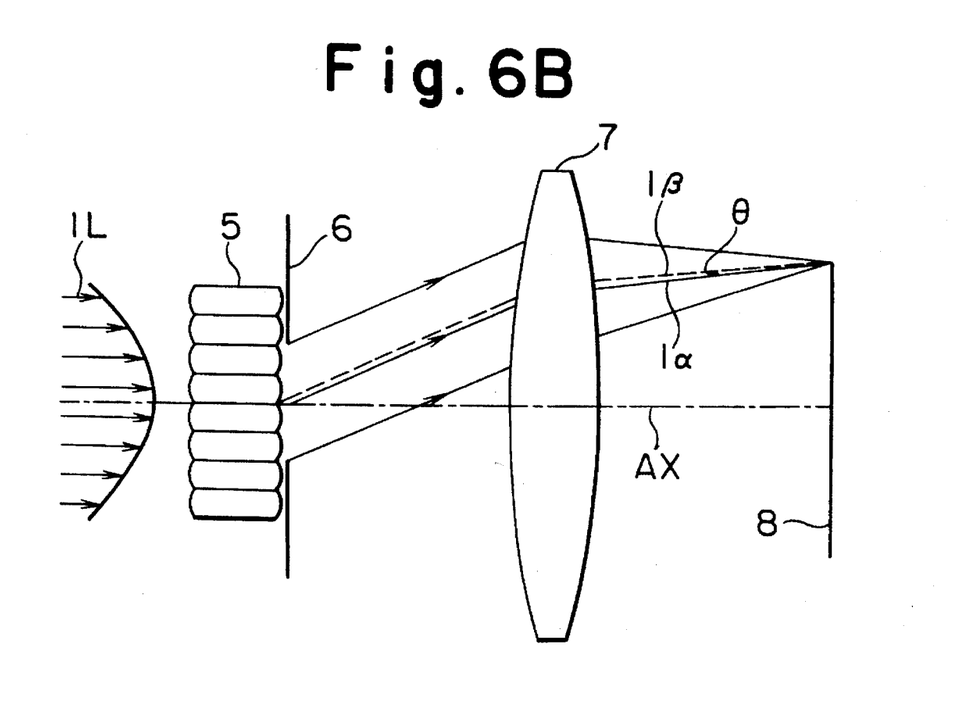

However, as shown in FIGS. 6A and 6B, when the diameter of the variable aperture stop 6 arranged on the exit surface of the fly-eye lens 5 changes, and the input range of the light beam IL which is incident on the fly-eye lens and has a higher brightness at its central portion varies, the angle θ of the effective principal ray Iβ with respect to the principal ray Iα changes, and an offset corresponding to the angle θ also changes, resulting in loss of telecentricity again.

When the illumination device shown in FIG. 1A is applied to a projection exposure apparatus for exposing a pattern on the pattern formation surface of the reticle 8 onto a wafer via a projection optical system, if the telecentricity is lost on the pattern formation surface of the reticle 8, the telecentricity on the exposure surface of the wafer is also lost, and a magnification error of a projected image on the wafer, or the like easily occurs. More specifically, in the projection exposure apparatus using the projection optical system, the error of telecentricity on the pattern formation surface of the reticle 8 must be minimized to maintain the telecentricity on the wafer with high precision.

In order to solve this problem, a mechanism for varying an optical system in front of the fly-eye lens 5 together with the variable aperture stop 6 may be proposed. However, when a variable adjustment mechanism is provided in addition to the variable aperture stop 6, the mechanism of the illumination device is complicated, and a control system for synchronously driving the variable aperture stop 6 and the added variable adjustment mechanism is required, resulting in an increase in manufacturing cost.

In an illumination device according to the present invention, a condition for maintaining the error amount of telecentricity on surface of an object 8 to be illuminated in FIG. 7A to be equal to or smaller than a predetermined allowable value A is obtained as follows. As shown in FIG. 5, the point c on the surface of the object 8 to be illuminated is conjugate with the points a and b on the incident surface of a fly-eye integrator 50. In this case, an orthogonal coordinate system of a plane perpendicular to the optical axis AX of the illumination device is defined by y- and z-axes, and the illuminance distribution on the incident surface of the fly-eye integrator 50 is expressed by a function e(y,z).

At this time, if the illuminance distribution e(y,z) is symmetrical about the optical axis AX, since the points a and b on the incident surface of the fly-eye integrator 50, which are conjugate with the point c with a large image height on the surface of the object 8 to be illuminated, are shifted from each other by a distance almost equal to the width of each of lens elements constituting the fly-eye integrator 50, the illuminance at the point a is smaller than that at the point b. Therefore, the barycentric position of the illuminance distribution of a light beam propagating toward the point c is shifted in the direction of the point b. In particular, the barycentric position of the illuminance distribution of a light beam which propagates toward a point with the largest image height on the surface of the object 8 to be illuminated is shifted most largely.

In practice, since the variable aperture stop 6 is arranged on the exit surface of the fly-eye integrator 50, the shift amount, from the optical axis AX in the radial direction, of the barycentric position of the illuminance distribution of a light beam, which emerges from the fly-eye integrator 50 via the variable aperture stop 6, is represented by S, and this shift amount S is expressed by a formula.

Figure 7A:
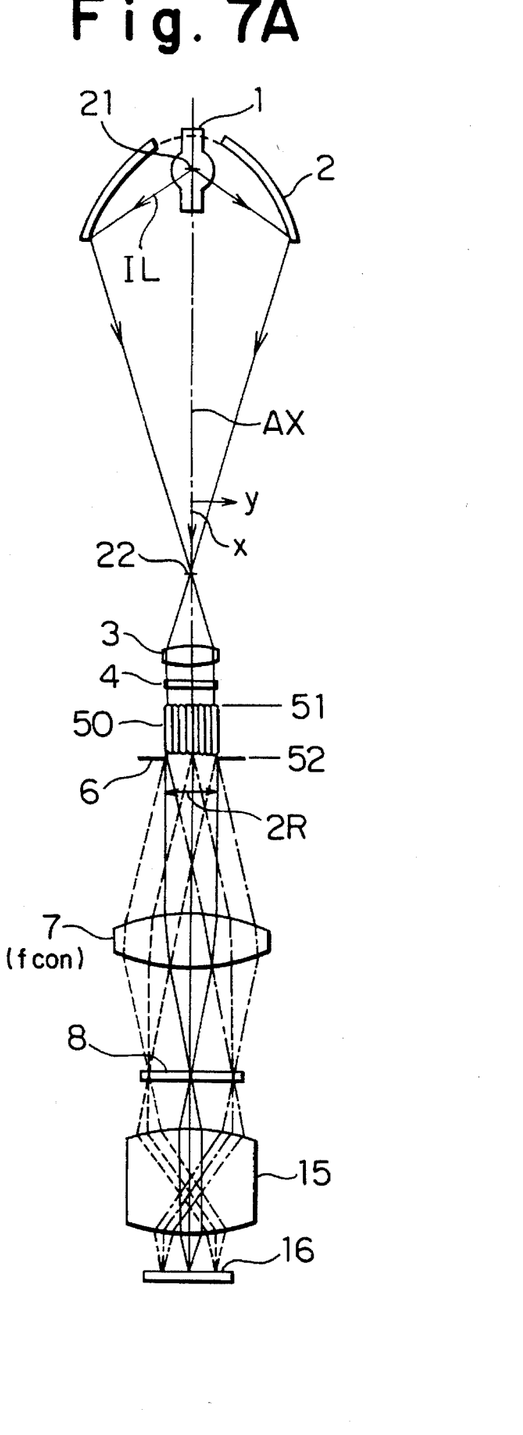
FIG. 7A is a schematic view showing the arrangement of a projection exposure apparatus according to the first embodiment of the present invention.
Figure 7B:
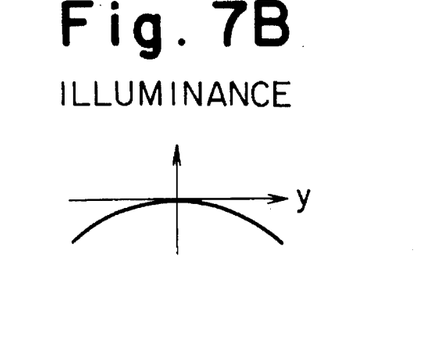
FIG. 7B is a graph showing the illuminance distribution on the incident surface of a fly-eye lens 50 shown in FIG. 7A.
Figure 7C:
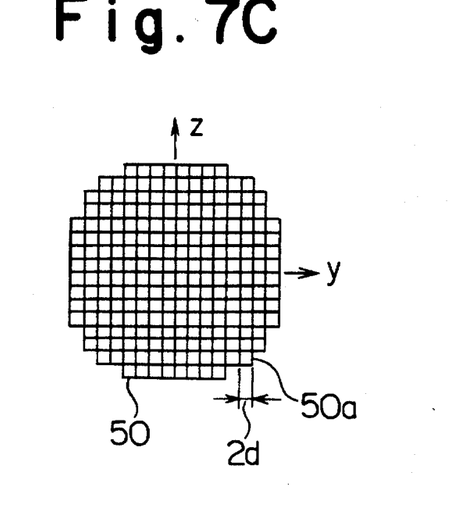
FIG. 7C is an enlarged front view of the fly-eye lens 50 shown in FIG. 7A.

Referring back to FIG. 7A, when the optical axis AX of the illumination device is defined by an x-axis, and an orthogonal coordinate system of a plane perpendicular to the optical axis AX is defined by y- and z-axes, the illuminance distribution e(y,z) on the incident surface of the fly-eye integrator 50 is rotation-symmetrical about the optical axis AX, as shown in FIG. 7B. As shown in FIG. 7C as the front view of the fly-eye integrator 50 in FIG. 7A, if the width, in the y-direction, of each lens element 50a which constitutes the fly-eye integrator 50 and has a square sectional shape is represented by 2d, and the inner diameter of the variable aperture stop 6 is represented by 2R, the shift amount S of the barycentric position of the illuminance distribution of a light beam emerging from the variable aperture stop 6 is given by:

$$S = \frac{\int\int_D ye(y-d,z)dydz}{\int\int_D e(y-d,z)dydz} \tag{18}$$

The integral range D in this case corresponds to a region satisfying $(y^2+z^2) \leq R^2$. A value obtained by converting the shift amount S into the error width of telecentricity on the surface of the object 8 to be illuminated within the variable range of the variable aperture stop 6 can be set to be equal to or smaller than A. More specifically, let $S_{max}$ and $S_{min}$ be respectively the shift amounts S obtained when the inner diameter 2R of the variable aperture stop 6 is $2R_{max}$ and $2R_{min}$, and it suffices to set the absolute value of the difference $(S_{max}-S_{min})$ of the shift amounts of the barycentric position of the illuminance distribution of the light beam to be equal to or smaller than $f_{con} \cdot A$ (where $f_{con}$ is the focal length of the condenser lens system 7). This condition is expressed by the following formula:

$$|S_{max}-S_{min}| = \left| \frac{\int\int_{D_{max}} ye(y-d,z)dydz}{\int\int_{D_{max}} e(y-d,z)dydz} - \frac{\int\int_{D_{min}} ye(y-d,z)dydz}{\int\int_{D_{min}} e(y-d,z)dydz} \right| \leq f_{con} \cdot A \tag{19}$$

The integral range $D_{max}$ in this case corresponds to a region satisfying $(y^2+z^2) \leq R_{max}^2$, and the integral range $D_{min}$ corresponds to a region satisfying $(y^2+z^2) \leq R_{min}^2$. The illuminance distribution e(y,z) on the incident surface of the fly-eye integrator 50 is approximated by a quadratic formula. More specifically, if $e(y,z)=a-b(z^2+y^2)=a-b\cdot r^2$, formula (18) is rewritten as:

$$S = \frac{\int\int_D y[a-b\{(y-d)^2+z^2\}]\,dy\,dz}{\int\int_D [a-b\{(y-d)^2+z^2\}]\,dy\,dz} = \frac{bdR^2}{2a-abd^2-bR^2} \quad (20)$$

The integral range D in this case also corresponds to a region satisfying $(y^2+z^2) \leq R^2$. When the aperture size of the variable aperture stop 6 is represented by 2R, the energy (power) W per unit time of a light beam passing the aperture is given by:

$$W = \int_0^R 2\pi r(a-br^2)\,dr = \pi(aR^2 - bR^4/2) \quad (21)$$

When a coefficient b is calculated from this formula, and is substituted in formula (20), the shift amount S of the barycentric position of the illuminance distribution is given by:

$$S = d\{a - W/(\pi R^2)\}/[a - 2d^2/R^2\{a - W/(\pi R^2)\} - \{a - W/(\pi R^2)\}] \quad (22)$$

Since the fly-eye integrator 50 splits an incident light beam into a relatively large number of beams, if $d^2/R^2 \cong 0$, formula (22) is rewritten as:

$$S = d(a\pi R^2/W - 1) \quad (23)$$

Using this formula to rewrite formula (19), we have:

$$S_{max} - S_{min} = a d\pi(R_{max}^2/W_{max} - R_{min}^2/W_{min}) \leq f_{con} \cdot A \quad (24)$$

where $W_{max}$ and $W_{min}$ are the powers of a light beam respectively obtained when the inner diameter 2R of the variable aperture stop 6 is a maximum value $2R_{max}$ and a minimum value $2R_{min}$.

In this case, it is determined based on the nature of an elliptic mirror that $(S_{max} - S_{min})$ never assumes a negative value, and hence the absolute value symbol is omitted. Since the illuminance distribution $e(y,z)$ on the incident surface of the fly-eye integrator 50 is approximated by a quadratic formula, the power $W_{min}$ obtained when the inner diameter 2R of the variable aperture stop 6 is the minimum value $2R_{min}$ is given by:

$$\int_0^{R_{min}} a2\pi r\,dr = a\pi R_{min}^2 = W_{min} \quad (25)$$

Substituting this formula (25) into formula (24), we have:

$$S_{max} - S_{min} = d\{(R_{max}^2 W_{min})/(W_{max} R_{min}^2) - 1\} \leq f_{con} \cdot A \quad (26)$$

When the illuminance on the surface of the object 8 to be illuminated obtained when the inner diameter 2R of the variable aperture stop 6 is the maximum value $2R_{max}$ is represented by $E_{max}$, and the illuminance on the surface of the object 8 to be illuminated obtained when the inner diameter 2R of the variable aperture stop 6 is the minimum value $2R_{min}$ is represented by $E_{min}$, since the variable aperture stop 6 is an aperture stop, the irradiation range on the surface of the object 8 to be illuminated remains the same even when the inner diameter 2R changes. In addition, since the surface of the object 8 to be illuminated has very high illuminance uniformity, $W_{min}/W_{max} = E_{min}/E_{max}$ is satisfied. Therefore, the following formula is derived from formula (26):

$$d\{(R_{max}^2 E_{min})/(E_{max} R_{min}^2) - 1\} \leq f_{con} \cdot A \quad (27)$$

This formula is the same as formula (1) in the present invention, and when this formula is satisfied, the error amount of telecentricity on the surface of the object 8 to be illuminated becomes equal to or smaller than A. In addition, in this case, none of the optical elements other than the variable aperture stop 6 need be moved at all, and the structure of the illumination device is simple.

Then, in the exposure apparatus of the present invention, a pattern on the mask surface 8 is projected and exposed on a surface 16 to be exposed via a projection optical system 15. If the projection magnification of the projection optical system 15 is represented by B, and the allowable error amount of telecentricity on the surface 16 to be exposed is represented by a, the allowable error amount of telecentricity on the mask surface 8 is given by B·a. The allowable amount B·a is a value corresponding to the allowable error amount A of telecentricity on the surface 8 of the object to be illuminated, which has already been described above, and substituting B·a into A of formula (27) yields:

$$d\{(R_{max}^2 E_{min})/(E_{max} R_{min}^2) - 1\} \leq f_{con} \cdot B \cdot a \quad (28)$$

This formula is the same as formula (2) in the present invention, and when this formula is satisfied, the error amount of telecentricity on the surface 16 to be exposed becomes equal to or smaller than a.

In a normal exposure apparatus, the allowable error amount a of telecentricity on the surface 16 to be exposed is preferably as small as about 0.01 [rad], as will be described below. Therefore, by substituting 0.01 into a in formula (2) or (28), the error amount of telecentricity on the surface 16 to be exposed becomes equal to or smaller than 0.01 [rad], and the resolution of a projected image on the surface 16 to be exposed is not lowered.

The allowable error amount of a transfer image of a reticle in an exposure apparatus for manufacturing a semiconductor element is normally ⅓ of the transfer line width (print line width).

Factors contributing to the variation of the transfer image of the reticle, a so-called image variation, include: ① a relative alignment error between a wafer and reticle; ② a distortion (optical image distortion) of a projection lens itself for projecting a reticle pattern onto a wafer; and ③ the error of telecentricity of illumination light.

Of these factors, factor ③ does not contribute to the image variation if the best focus position of the projection lens is considered. However, in practice, since (1) a three-dimensional pattern is present on the wafer, and (2) the resist (photosensitive material) has a thickness, a given depth (an exposable depth, in the normal direction, on the surface to be irradiated) with respect to an optimal exposure surface at the best focus position is required. Therefore, when the center of the thickness of an object to be exposed with a certain thickness is set to be the best focus position, both the upper and lower surfaces of the object correspond to defocus positions. For this reason, if the telecentricity is lost, an image variation occurs at these defocus positions.

The three factors (① to ③) of the image variation are empirically known to contribute to the variation amount of the transfer image by substantially the same amounts. Therefore, the allowable image variation amount caused by the error of telecentricity of illumination light must be as small as ⅕ of the transfer line width (print line width).

Normally, in an exposure apparatus for manufacturing a semiconductor element, since an actual process requires an exposure surface depth of at least about 1 μm, the allowable error amount a of telecentricity of illumination light is given by:

$$a = \frac{\text{transfer line width (print line width)}}{15 \times (\text{depth of exposure surface required in actual process})}$$

Therefore, when a line with a width of about 0.5 μm is printed on a wafer, the allowable error amount a of telecentricity is preferably set to be about 0.03 rad from the above equation, and if the projection magnification of the projection lens is ×⅕, the allowable amount is preferably set to be 0.006 rad on the reticle.

On the other hand, when a line with a width of about 0.3 μm is printed on a wafer, the allowable error amount a of telecentricity is preferably set to be about 0.02 rad from the above equation, and if the projection magnification of the projection lens is ×⅕, the allowable amount is preferably set to be 0.004 rad on the reticle.

Furthermore, when a line with a width of about 0.15 μm is printed on a wafer, the allowable error amount a of telecentricity is preferably set to be about 0.01 rad from the above equation, and if the projection magnification of the projection lens is ×⅕, the allowable amount is preferably set to be 0.002 rad on the reticle.

Embodiment 1

The first embodiment of an illumination optical system according to the present invention will be described below with reference to FIGS. 7A to 7C. In this embodiment, the present invention is applied to a projection exposure apparatus, and the same reference numerals in FIGS. 7A to 7C denote the same parts as in FIGS. 1A to 1C.

FIG. 7A shows the projection exposure apparatus of this embodiment. Referring to FIG. 7A, a mercury lamp 1 as a light source is arranged at a first focal point 21 of a rotary elliptic surface of a focusing mirror 2, and a light source image (secondary light source) is formed at a second focal point 22 of the rotary elliptic surface. A light beam emanating from the secondary light source is converted into an almost collimated light beam by a collimator lens 3. The light beam almost collimated by the collimator lens 3 is incident on a band-pass filter 4, and illumination light of an exposure wavelength (g-line, i-line, or the like) selected by the band-pass filter 4 is incident on a fly-eye lens 50, thus forming a large number of light source images (tertiary light sources) on an exit-side focal plane 52 of the fly-eye lens 50. A variable aperture stop 6 with an aperture size 2R is arranged on the focal plane 52, and light beams emanating from the large number of tertiary light sources in the variable aperture stop 6 are focused by a condenser lens 7 with a focal length $f_{con}$, and illuminate a pattern on a pattern formation surface of a reticle 8 at a uniform illuminance in an overlapping manner. As in FIG. 1A, an x-axis is defined in a direction parallel to the optical axis AX, and a plane perpendicular to the x-axis is defined as a y-z plane.

In this case, an incident surface (incident-side focal plane) 51 of the fly-eye lens 50 is conjugate with the pattern formation surface of the reticle 8 by the condenser lens 7. Under the illumination light from the condenser lens 7, the pattern on the reticle 8 is transferred and exposed on the exposure surface of a wafer 16 via a bi-telecentric projection optical system 15 with a magnification B.

FIG. 7B shows the illuminance distribution of illumination light on the incident surface of the fly-eye lens 50. As shown in FIG. 7B, the illuminance distribution is rotation-symmetrical about the optical axis AX, and can be roughly approximated by a quadratic function of a distance r from the optical axis AX. FIG. 7C is a front view of the fly-eye lens 50 shown in FIG. 7A. As shown in FIG. 7C, the sectional shape of each of a large number of lens elements 50a constituting the fly-eye lens 50 is a square, each side of which is parallel to the y- or z-axis, and the width, in the y-direction, of the square (equal to that in the z-direction) is represented by 2d.

Figure 1C:
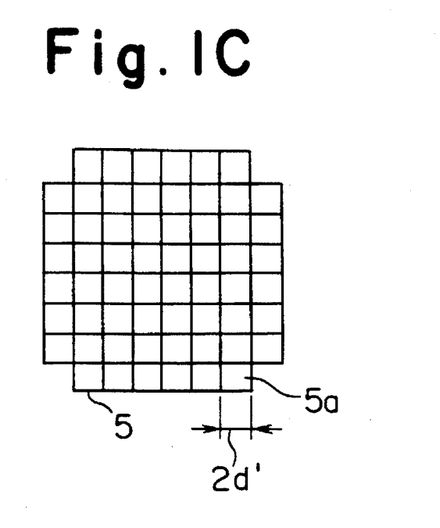
FIG. 1C is an enlarged front view of the fly-eye lens 5 shown in FIG. 1A.

In this case, the number of divisions of the fly-eye lens 50 of this embodiment is larger than that of the fly-eye lens 5 shown in FIG. 1C. More specifically, the width 2d of the sectional shape of each lens element 50a constituting the fly-eye lens 50 of this embodiment is smaller than the width 2d' of the sectional shape of each lens element 5a constituting the fly-eye lens 5 shown in FIG. 1C. For example, in this embodiment, the focal length $f_{con}$ of the condenser lens 7 is set to be 500 mm, the width 2d of each lens element 50a constituting the fly-eye lens 50 is set to be 4.0 mm (d=2.0 mm), and the magnification B of the projection optical system 15 is set to be ×⅕. Since the aperture size 2R of the variable aperture stop 6 is changed within a range from 30 mm to 70 mm, the minimum value $R_{min}$ and the maximum value $R_{max}$ of the radius R are respectively 15 mm and 35 mm.

The illuminance $E_{min}$ on the exposure surface of the wafer 16 obtained when the radius R has the minimum value $R_{min}$ is 141 mW/cm², and the illuminance $E_{max}$ on the exposure surface of the wafer 16 obtained when the radius R has the maximum value $R_{max}$ is 569 mW/cm². When the allowable error amount a of telecentricity on the exposure surface of the wafer 16 is set to be 0.01 rad, the right- and left-hand sides of formula (2) are:

$$d\{(R_{max}^2 E_{min})/(E_{max} R_{min}^2)-1\}=0.70 \; f_{con} \cdot B \cdot a=1.00$$

Therefore, since formula (2) is satisfied, the error amount of telecentricity on the exposure surface of the wafer 16 is maintained to be equal to or smaller than 0.01 rad, and the resolution of a projected image can be prevented from deteriorating. In this case, the error amount of telecentricity on the reticle 8 is maintained to be equal to or smaller than 0.002 rad. In other words, in this example, formula (1) of the present invention is satisfied for a condition in that the allowable value A of telecentricity on the reticle 8 is 0.002 rad.

In actual exposure, when the aperture size 2R of the variable aperture stop 6 is changed from 30 mm to 60 mm, the error of telecentricity on the wafer 16 is 0.008 rad or less, and a reticle pattern can be satisfactorily printed on the wafer 16 by adjusting other exposure conditions with good balance.

For the purpose of comparison, whether or not the system shown in FIG. 1A satisfies formula (2) will be examined below. In the system shown in FIG. 1A, assume that the projection optical system 15 and the wafer 16 shown in FIG. 7A are arranged below the reticle R. In the system shown in FIG. 1A, the focal length $f_{con}$ of the condenser lens 7, the magnification B of the projection optical system 15, a minimum value $R_{min}'$ and a maximum value $R_{max}'$ of a radius R' of an aperture size 2R' of the variable aperture stop 6, and illuminances $E_{min}$ and $E_{max}$ on the exposure surface of the wafer 16 respectively obtained when the radius R' is the minimum value $R_{min}'$ and the maximum value $R_{max}'$ are the same as those in the conditions of this embodiment. However, as shown in FIG. 1C, the width 2d' of each lens element 5a constituting the fly-eye lens 5 is 8.0 mm (d'=4.0 mm), and the number of divisions of the fly-eye lens 5 is smaller than of the fly-eye lens 50 of this embodiment.

In this system, when the allowable error amount a of telecentricity on the exposure surface of the wafer 16 is set to be 0.01 rad, the right- and left-hand sides of formula (2) are calculated as follows (in this case, R and d are respectively replaced by R' and d'):

$$d'\{(R_{max}'^2 E_{min})/(E_{max} R_{min}'^2) - 1\} = 1.40 \, f_{con} \cdot B \cdot a = 1.00$$

Therefore, since formula (2) is not satisfied, the error amount of telecentricity on the exposure surface of the wafer 16 becomes larger than the allowable amount. Upon execution of actual exposure in this system, when the aperture size 2R' of the variable aperture stop 6 is changed from 30 mm to 70 mm, the telecentricity has an error of 0.018 rad on the exposure surface of the wafer 16, and the magnification of the pattern image on the reticle 8 varies in a defocus state.

In the above embodiment, the present invention is applied to the projection exposure apparatus for exposing a pattern on the reticle onto the wafer via the projection optical system. The present invention is also applicable to a proximity type exposure apparatus which directly exposes a pattern image on the reticle onto a wafer arranged in the vicinity of the reticle. Since the proximity type apparatus has no projection optical system, any error of the telecentricity on the reticle can be suppressed to be equal to or smaller than a predetermined allowable value by satisfying formula (1) of the conditions of the present invention.

Embodiment 2

Figure 8A:
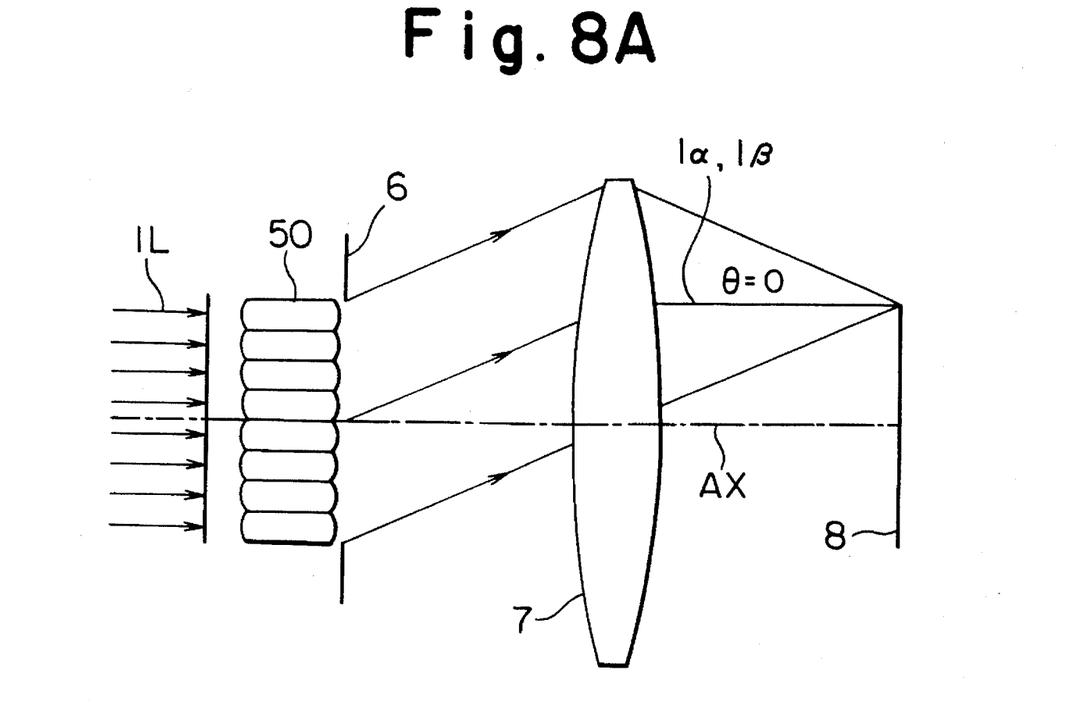
FIGS. 8A and 8B are explanatory views showing the fact that the telecentricity can be prevented from being lost when a light beam to be incident on the fly-eye lens has a uniform illuminance distribution, in the second embodiment of the present invention.
Figure 8B:
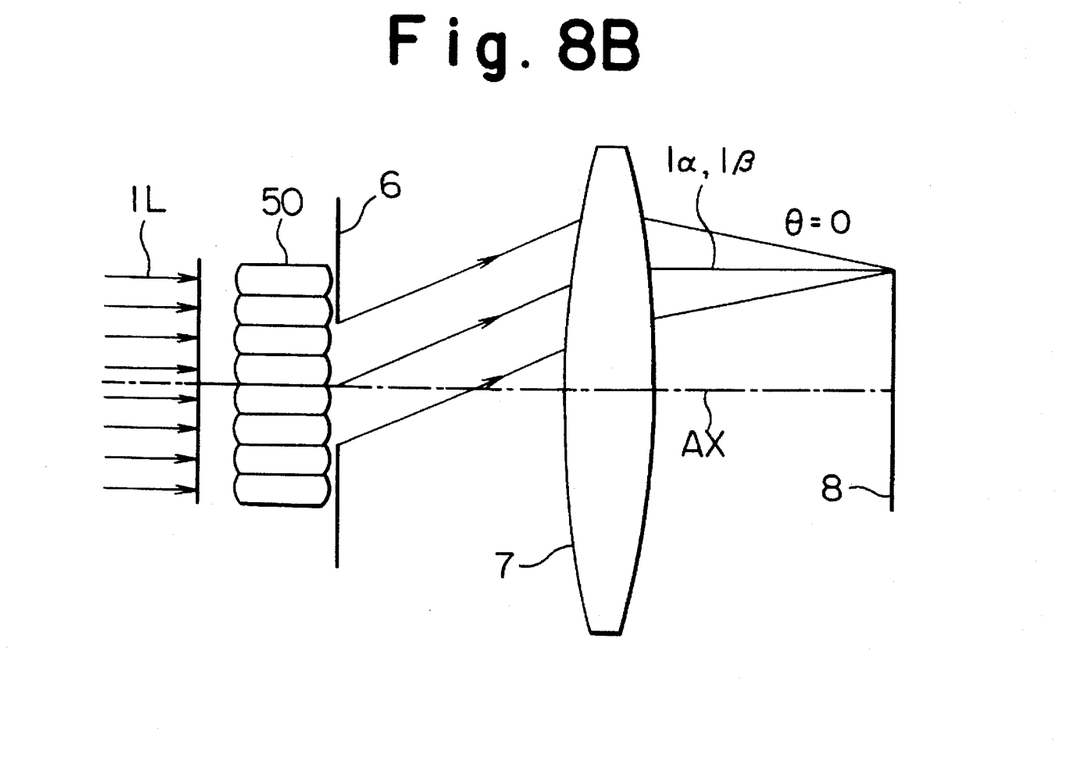

The second embodiment associated with another means for minimizing the error of telecentricity will be described below. In this embodiment, as shown in FIGS. 8A and 8B, the light beam IL incident on the fly-eye lens 50 has a uniform illuminance distribution. In this case, even when the aperture size of the variable aperture stop 6 is increased, as shown in FIG. 8A, or when the aperture size of the variable aperture stop 6 is decreased, as shown in FIG. 8B, since the principal ray Iα of the light beam overlaps the effective principal ray Iβ, no design offset is generated, and the telecentricity can be prevented from being lost. In order to form a surface with a strictly uniform illuminance distribution on the incident surface side of the fly-eye lens 50 as in this method, another fly-eye lens may be provided in front of the fly-eye lens 50 to adopt a so-called double fly-eye arrangement.

When the light beam incident on the fly-eye lens 50 has a uniform illuminance distribution, since the area of the aperture portion of the variable aperture stop 6 is proportional to the illuminance on the illumination region on the reticle 8 (the same applies to that on the wafer 16), the following relation holds:

$$(R_{max}^2 E_{min})/(E_{max} R_{min}^2) - 1 = 0$$

Therefore, formulas (1) and (2) hold independently of the value of the width 2d of the lens element 50a of the fly-eye lens 50, and any error of telecentricity can always be prevented.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No. 6-40771 (40771/1994) filed on Mar. 11, 1994 is hereby incorporated by reference.

What is claimed is:

1. An illumination device which comprises:

a light source system for generating illumination light;

an optical integrator which is constituted by lens elements each having a predetermined size, and forms a plurality of light source images on the basis of the light beam from said light source system;

a variable aperture stop arranged on a position where said plurality of light source images are formed; and a condenser optical system for guiding the light beams from said optical integrator to a surface of an object to be illuminated, wherein when a width, in a predetermined direction, of each of a plurality of lens elements constituting said optical integrator is represented by 2d, a focal length of said condenser optical system is represented by $f_{con}$, maximum and minimum values of an effective diameter of said variable aperture stop are respectively represented by $2R_{max}$ and $2R_{min}$, and average values of irradiance on the surface of the object to be illuminated respectively obtained when the effective diameter of said variable aperture stop assumes the maximum and minimum values are represented by $E_{max}$ and $E_{min}$, and an allowable error amount of telecentricity on the surface of the object to be illuminated is represented by A, said illumination device satisfies:

$$d\{(R_{max}^2 E_{min})/(E_{max} R_{min}^2) - 1\} \leq f_{con} \cdot A$$

wherein d is a half width, in a predetermined direction, of each a plurality of lens elements constituting said optical integrator.

2. A device according to claim 1, further comprising a collimate optical system for converting the illumination light from said light source system into a substantially collimated light beam.

3. A device according to claim 1, wherein said condenser optical system makes an incident surface of said optical integrator conjugate with the surface of the object to be illuminated.

4. A device according to claim 1, wherein said light source system comprises a light source for generating the illumination light, and an elliptic mirror having a first focal point at which said light source is arranged.

5. A device according to claim 1, wherein the allowable error amount A of telecentricity on the surface of the object to be illuminated is 0.006 rad.

6. A device according to claim 1, wherein the allowable error amount A of telecentricity on the surface of the object to be illuminated is 0.004 rad.

7. A device according to claim 1, wherein the allowable error amount A of telecentricity on the surface of the object to be illuminated is 0.002 rad.

8. An exposure apparatus which comprises:

a light source system for generating illumination light;

a optical integrator which is constituted by lens elements each having a predetermined size, and forms a plurality of light source images on the basis of the light beam from said light source system;

a variable aperture stop arranged on a position where said plurality of light source images are formed;

a condenser optical system for guiding the light beams from said optical integrator to a mask surface; and a projection optical system for exposing a pattern on the mask surface onto an object to be exposed, wherein when a width, in a predetermined direction, of each of a plurality of lens elements constituting said optical integrator is represented by 2d, a focal length of said condenser optical system is represented by $f_{con}$, a projection magnification of said projection optical system is represented by B, maximum and minimum values of an effective diameter of said variable aperture stop are respectively represented by $2R_{max}$ and $2R_{min}$, and average values of irradiance on the mask surface respectively obtained when the effective diameter of said variable aperture stop assumes the maximum and minimum values are represented by $E_{max}$ and $E_{min}$, and an allowable error amount of telecentricity on the mask surface is represented by a, said exposure apparatus satisfies:

$$d\{(R_{max}^2 E_{min})/(E_{max} R_{min}^2)-1\} \leq f_{con} \cdot B \cdot a$$

wherein d is a half width, in a predetermined direction, of each a plurality of lens elements constituting said optical integrator.

9. A apparatus according to claim 8, further comprising a collimate optical system for converting the illumination light from said light source system into a substantially collimated light beam.

10. A apparatus according to claim 8, wherein said condenser optical system makes an incident surface of said optical integrator conjugate with the mask surface.

11. An apparatus according to claim 8, wherein said light source system comprises a light source for generating the illumination light, and an elliptic mirror having a first focal point at which said light source is arranged.

12. An apparatus according to claim 8, wherein the allowable error amount a of telecentricity on the surface of said object to be exposed is 0.03 rad.

13. An apparatus according to claim 8, wherein the allowable error amount a of telecentricity on the surface of said object to be exposed is 0.02 rad.

14. An apparatus according to claim 8, wherein the allowable error amount a of telecentricity on the surface of said object to be exposed is 0.01 rad.

15. An illumination device which comprises:

a light source system for generating illumination light;

an optical integrator comprised of lens elements each having a predetermined size, and forms a plurality of light source images on the basis of the light beam from said light source system, a width, in a predetermined direction, of each of a plurality of lens elements constituting said optical integrator being represented by 2d;

a variable aperture stop arranged on a position where said plurality of light source images are formed, maximum and minimum values of an effective diameter of said variable aperture stop being respectively represented by $2R_{max}$ and $2R_{min}$, and average values of irradiance on the surface of the object to be illuminated respectively obtained when the effective diameter of said variable aperture stop assumes the maximum and minimum values being represented by $E_{max}$ and $E_{min}$, and a condenser optical system for guiding the light beams from said optical integrator to a surface of an object to be illuminated, a focal length of said condenser optical system represented by $f_{con}$ satisfying:

$$f_{con} \geq d\{(R_{max}^2 E_{min})/(E_{max} R_{min}^2)-1\}/0.006$$

wherein d is a half width, in a predetermined direction, of each a plurality of lens elements constituting said optical integrator.

16. An exposure apparatus which comprises:

a light source system for generating illumination light;

an optical integrator comprised of lens elements each having a predetermined size, and forms a plurality of light source images on the basis of the light beam from said light source system, a width, in a predetermined direction, of each of a plurality of lens elements constituting said optical integrator being represented by 2d;

a variable aperture stop arranged on a position where said plurality of light source images are formed, maximum and minimum values of an effective diameter of said variable aperture stop being respectively represented by $2R_{max}$ and $2R_{min}$, and average values of irradiance on the mask surface respectively obtained when the effective diameter of said variable aperture stop assumes the maximum and minimum values being represented by $E_{max}$ and $E_{min}$; and a condenser optical system for guiding the light beams from said optical integrator to a mask surface, a focal length of said condenser optical system being represented by $f_{con}$; and a projection optical system for exposing a pattern on the mask surface onto an object to be exposed, a projection magnification of said projection optical system represented by B satisfying:

$$B \geq d\{(R_{max}^2 E_{min})/(E_{max} R_{min}^2)-1\}/(0.03 \cdot f_{con})$$

wherein d is a half width, in a predetermined direction, of each a plurality of lens elements constituting said optical integrator.

* * * * *